(12) United States Patent
Chen et al.

(10) Patent No.: US 12,046,496 B2
(45) Date of Patent: Jul. 23, 2024

(54) DEVICE OF MASS TRANSFERRING CHIPS

(71) Applicant: AU Optronics Corporation, Hsin-Chu (TW)

(72) Inventors: Wei-Chieh Chen, Hsin-Chu (TW); Kuan-Yi Lee, Hsin-Chu (TW); Wen-Hsien Tseng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 364 days.

(21) Appl. No.: 17/481,338

(22) Filed: Sep. 22, 2021

(65) Prior Publication Data
US 2022/0359249 A1 Nov. 10, 2022

(30) Foreign Application Priority Data
May 5, 2021 (TW) .................. 110116277

(51) Int. Cl.
H01L 21/00 (2006.01)
H01L 21/67 (2006.01)
H01L 21/673 (2006.01)
H01L 21/68 (2006.01)
H01L 25/075 (2006.01)
H01L 33/00 (2010.01)

(52) U.S. Cl.
CPC .. *H01L 21/67326* (2013.01); *H01L 21/67115* (2013.01); *H01L 21/68* (2013.01); *H01L 25/0753* (2013.01); *H01L 33/005* (2013.01); *H01L 2221/68313* (2013.01); *H01L 2221/68372* (2013.01)

(58) Field of Classification Search
CPC ......... H01L 21/67326; H01L 21/67115; H01L 21/68; H01L 25/0753; H01L 33/005; H01L 2221/68313; H01L 2221/68372; H01L 21/67144; H01L 33/0093; H01L 33/0095
See application file for complete search history.

(56) References Cited

U.S. PATENT DOCUMENTS

| 2010/0109024 | A1 | 5/2010 | Yonehara et al. |
| 2013/0210175 | A1 | 8/2013 | Hoisington et al. |
| 2014/0159065 | A1* | 6/2014 | Hu .......................... H01L 24/75 438/34 |
| 2015/0171313 | A1 | 6/2015 | Hoisington et al. |
| 2018/0138071 | A1 | 5/2018 | Bower et al. |

(Continued)

FOREIGN PATENT DOCUMENTS

| CN | 106340571 A | 1/2017 |
| CN | 110034212 A * | 7/2019 |

(Continued)

*Primary Examiner* — Lynn E Schwenning
*Assistant Examiner* — Lucia Elba Rodriguez
(74) *Attorney, Agent, or Firm* — WPAT, P.C

(57) ABSTRACT

A device of mass transferring chips includes a first substrate, which includes a first surface with a chip-connecting area configured to attach a chip, a second surface opposite to the first surface, and a patterned recess. The patterned recess is disposed on the first surface or the second surface. A projection of at least a portion of the patterned recess on the first surface is spaced apart from the chip-connecting area. The device further includes a second substrate with a third surface. The third surface has a chip-receiving area configured to attach the chip from the first substrate.

7 Claims, 16 Drawing Sheets

(56) References Cited

U.S. PATENT DOCUMENTS

2018/0269234 A1* 9/2018 Hughes ................ H01L 27/156
2019/0088526 A1   3/2019 Bower et al.
2019/0385886 A1   12/2019 Bower et al.
2020/0411717 A1* 12/2020 Keates ................ H01L 33/0095

FOREIGN PATENT DOCUMENTS

| CN | 107210293 B   | * | 12/2019 | ......... H01L 21/6835 |
|----|---------------|---|---------|------------------------|
| CN | 111477651 A   |   | 7/2020  |                        |
| CN | 111628053 A   |   | 9/2020  |                        |
| CN | 111933653 A   |   | 11/2020 |                        |
| KR | 20190050201 A | * | 11/2017 |                        |
| TW | 201023243 A   |   | 6/2010  |                        |
| TW | 201834133 A   |   | 9/2018  |                        |
| WO | WO-2019088763 A1 | * | 5/2019 | ......... H01L 25/0753 |

\* cited by examiner

DEVICE OF MASS TRANSFERRING CHIPS

CROSS-REFERENCE TO RELATED APPLICATION

This application claims priority to Taiwan Application Serial Number 110116277, filed May 5, 2021, which is herein incorporated by reference in its entirety.

BACKGROUND

Field of Invention

The present disclosure relates to a device of transferring chips. More particularly, the present disclosure relates to a device of mass transferring chips.

Description of Related Art

The light-emitting diode (LED) is widely applied in illuminations and displays for its advantages including small size, low power consumption, long life time, luminescence, and so on. The micro LED is a new technique in displays for better contrast, prompter reaction and lower power consumption.

The micro LED is produced in a form of a single chip. Therefore, during the manufacture of display devices, micro LEDs are transferred onto another substrate (e.g., carrier substrate) in a method of mass transfer. Increasing the transfer rate of chip from growth substrate to another substrate can enhance manufacture yield in the subsequent processes of display devices with micro LED.

SUMMARY

An aspect of the present disclosure provides a device of mass transferring chips. The device of mass transferring chips includes a first substrate, which includes a first surface with a chip-connecting area configured to attach a chip, a second surface opposite to the first surface, and a patterned recess. The patterned recess is disposed on the first surface or the second surface. A projection of at least a portion of the patterned recess on the first surface is spaced apart from the chip-connecting area. The device further includes a second substrate with a third surface. The third surface has a chip-receiving area configured to attach the chip from the first substrate.

An aspect of the present disclosure provides a device of mass transferring chips. The device of mass transferring chips includes a first substrate, which includes a chip-connecting area configured to connect a chip. The device further includes a second substrate, which includes a support layer and a first adhesive layer. The chip is between the first substrate and the second substrate. The first adhesive layer includes a first surface, a second surface, and a patterned recess. The first surface has a chip-receiving area configured to attach the chip from the first substrate. The second surface is opposite to the first surface and in contact with a first side of the support layer. The patterned recess is disposed on the first surface and spaced apart from the chip-receiving area.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
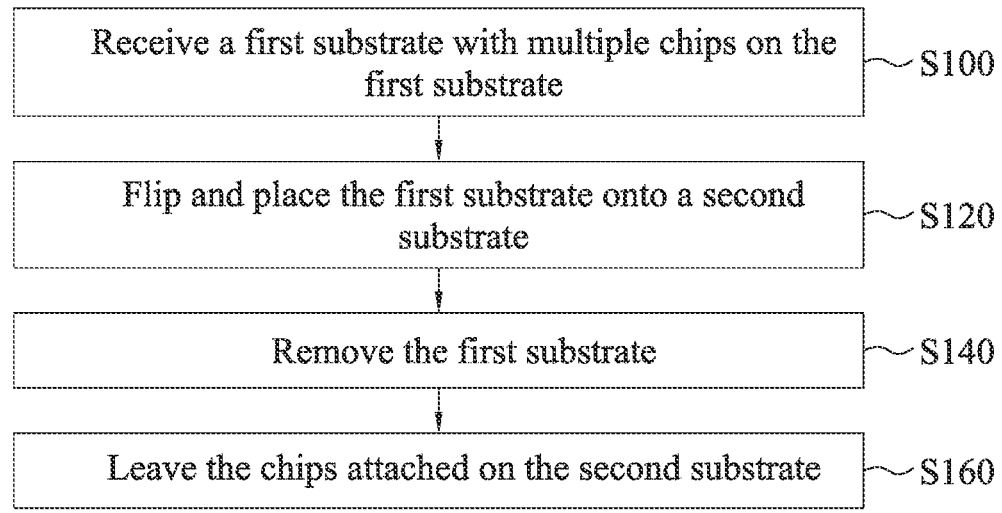
FIG. 1 is a flow diagram illustrating an operation of mass transferring chips, in accordance with some embodiments.

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the disclosure. For illustration clarity, many details of practice are explained in the following descriptions. However, it should be understood that these details of practice do not intend to limit the present disclosure. That is, these details of practice are not necessary in parts of embodiments of the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The use of ordinals such as first, second and third does not necessarily imply a ranked sense of order, but rather may only distinguish between multiple instances of an act or structure.

In some embodiments, the terms "about" and "substantially" can refer to a percentage of the values as interpreted by those skilled in relevant art(s) in light of the teachings herein. The terms "about" and "substantially" can indicate a value of a given quantity that varies within an acceptable deviation of the value. These values are merely examples and are not intended to be limiting.

Figure 2A:
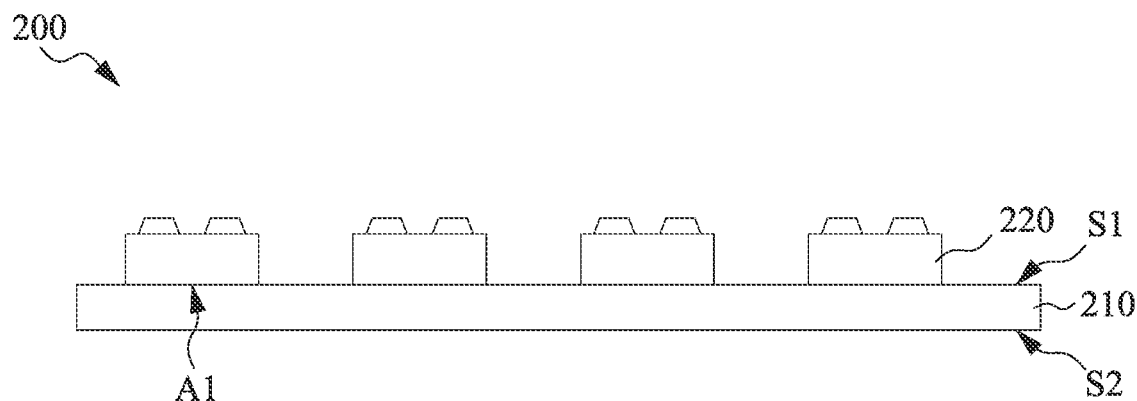
FIG. 2A is a side view of a device of mass transferring chips in an intermediate stage, in accordance with some embodiments.
Figure 2B:
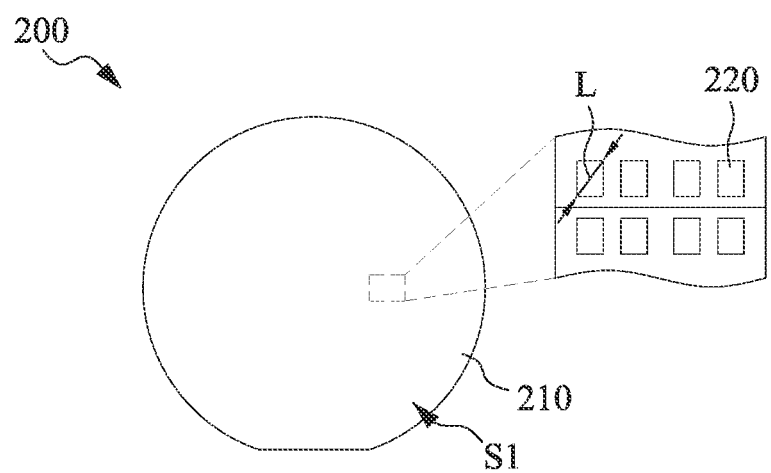
FIG. 2B is a top view of a device of mass transferring chips in an intermediate stage, in accordance with some embodiments.

Referring to FIGS. 1, 2A and 2B, FIG. 1 is a flow diagram illustrating an operation of mass transferring chips in accordance with some embodiments, FIG. 2A is a side view of a device 200 of mass transferring chips in an intermediate stage in accordance with some embodiments, and FIG. 2B is a top view of the device 200 of mass transferring chips in an intermediate stage in accordance with some embodiments.

The operation of mass transferring chips begins with step S100 and the process of receiving a first substrate 210. The first substrate 210 includes a first surface S1 and a second surface S2 opposite to each other. The first surface S1 includes a chip-connecting area A1 configured to connect a chip 220. The first substrate 210 may include a sapphire substrate, a gallium nitride substrate, an aluminum nitride substrate, a silicon substrate, a gallium arsenide substrate, a silicon carbide substrate, or other suitable substrates. In some embodiments, the first substrate 210 can be a growth substrate for the chip 220, and in such embodiments, the first substrate 210 can usually include the sapphire substrate.

The chips 220 may be disposed in an array on the first surface S1 of the first substrate 210. In some embodiments, the chip 220 may a light-emitting diode (LED) chip. Further, the chip 220 can be referred to as a microchip as the chip 220 is in a micro scale. For example, a diagonal length L of each chip 220 is within a range of about 1 micrometer (μm) to about 100 μm. In preferable example, the diagonal length L of each chip 220 is within a range of about 10 μm to about 50 μm. In some embodiments where the chip 220 is a size in a micro scale, the chip 220 can be micro LED chip. In some embodiments, the chip 220 is a flip-chip type micro LED chip, meaning electrodes and light-emitting surface are disposed in different sides. In some other embodiments, the chip 220 can be a vertical type micro LED chip (electrodes and light-emitting surface are disposed in the same side), which are not limited by the present disclosure.

Figure 2C:
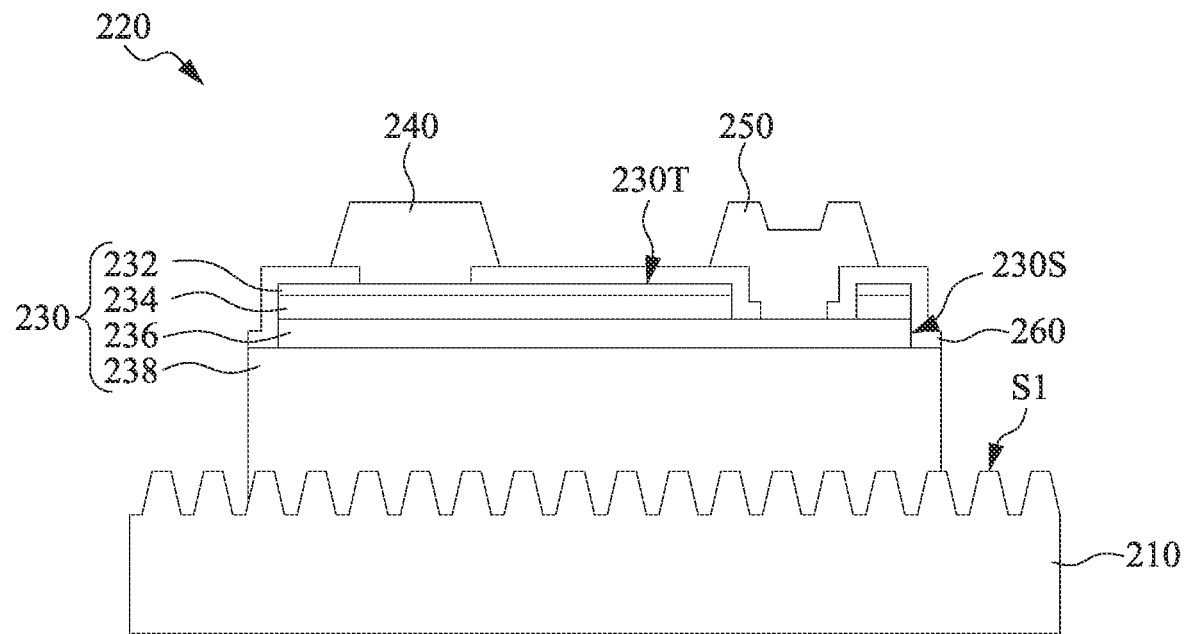
FIG. 2C is a cross-sectional view of a chip, in accordance with some embodiments.

Referring to FIG. 2C, FIG. 2C is a cross-sectional view of the chip 220 in accordance with some embodiments. The chip 220 includes an epitaxial stack layer 230, a first electrode 240, a second electrode 250, and a protection layer 260. The epitaxial stack layer 230 includes a P-type doped semiconductor layer 232, a light-emitting layer 234, an N-type doped semiconductor layer 236, and an undoped semiconductor layer 238. The light-emitting layer 234 is disposed between the P-type doped semiconductor layer 232 and N-type doped semiconductor layer 236. The undoped semiconductor layer 238 is disposed between N-type doped semiconductor layer 236 and the first substrate 210.

The undoped semiconductor layer 238 may serve as a low temperature nucleation layer or a buffer layer. When the undoped semiconductor layer 238 serves as the low temperature nucleation layer, a major constituent of the undoped semiconductor layer 238 can be GaN. When the undoped semiconductor layer 238 serves as the low temperature nucleation layer, the major constituent of the unintentionally doped semiconductor layer 218 can be AlN or a buffer layer formed during a non-epitaxially-grow process, such as GaN, AlN, SiC or a combination containing a carbon material or carbon covalent bond, for example.

The chip 220 of the present embodiment is a GaN-based LED, for example. In such embodiments, the P-type doped semiconductor layer 232 is, for example, a P-type GaN layer (p-GaN), and the N-type doped semiconductor layer 236 is, for example, an N-type GaN layer (n-GaN). In addition, the light-emitting layer 234 is referred to as an active layer and a structure thereof is, for example, a multiple quantum well (MQW) formed by alternately stacking multiple InGaN layers and multiple GaN layers. The undoped semiconductor layer 238 is, for example, an undoped GaN layer (u-GaN).

The first electrode 240 and the second electrode 250 include conductive materials. In some embodiments, the conductive materials of the first electrode 240 and the second electrode 250 may be In, Sn, Al, Au, Pt, Zn, Ge, Ag, Pb, Pd, Cu, AuBe, BeGe, Ni, PbSn, Cr, AuZn, Ti, W, TiW, other suitable materials, or a combination thereof. In some embodiments, the first electrode 240 and the second electrode 250 may include transparent conductive materials such as indium tin oxide (ITO), an indium zinc oxide (IZO) or a transparent metal layer, but the present disclosure is not limited to the above.

The protection layer 260 covers a part of a side surface 230S of the epitaxial stack layer 230 and a part of a top surface 230T of the epitaxial stack layer 230. The protection layer 260 provides functions of electrical insulatin, protection, or reflection. A material of the protection layer 260 may be silicon oxide, silicon nitride, or a stack combination of two materials with different refractive indexes. However, the preset disclosure is not limited to the above.

As illustrated in FIG. 2C, the first surface S1 of the first substrate 210 may has a rough texture on which the chip 220 is disposed.

Figure 3A:
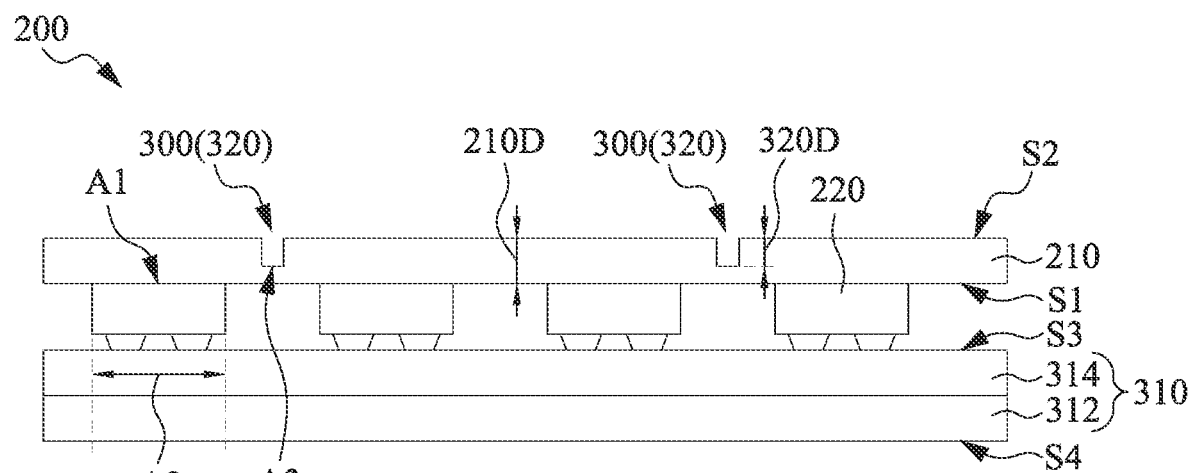
FIG. 3A is a side view of a device of mass transferring chips in an intermediate stage, in accordance with some embodiments.
Figure 3B:
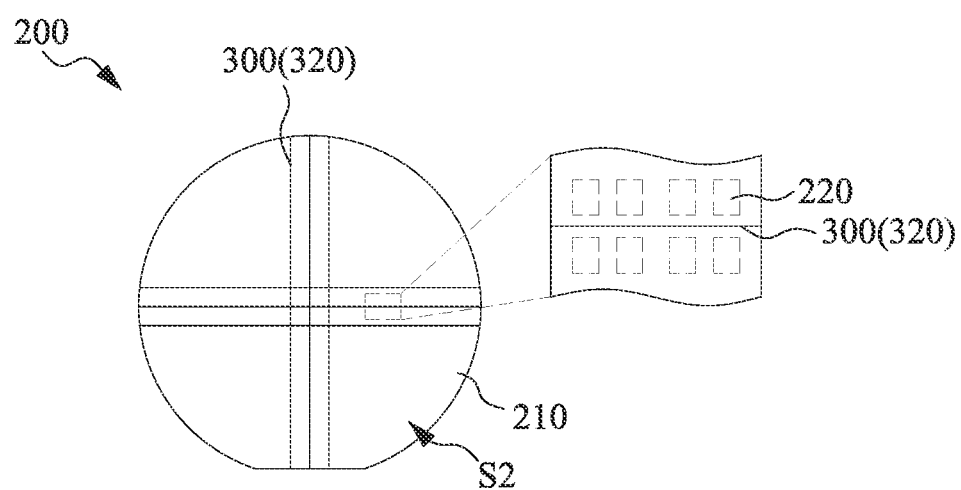
FIG. 3B is a top view of a device of mass transferring chips in an intermediate stage, in accordance with some embodiments.

Referring to FIGS. 1, 3A and 3B, FIG. 3A is a side view of the device 200 of mass transferring the chips 220 in an intermediate stage in accordance with some embodiments, and FIG. 3B is a top view of the device 200 of mass transferring the chips 220 in an intermediate stage in accordance with some embodiments. It is noted that, in the top view of FIG. 3B, the chips 220 disposed on the first surface S1 cannot be observed due to the observation direction (i.e., the second surface S2 is observed). Therefore, the exemplary positions of the chips 220 disposed on the first surface S1 are indicated with the broken lines in the second surface S2.

The device 200 of mass transferring the chips 220 further includes a second substrate 310. In step S120, the first substrate 210 is flipped and placed onto the second substrate 310 with the first surface S1 of the first substrate 210 facing the second substrate 310, and the second surface S2 of the first substrate 210 exposed. In another words, the chip-connecting area A1 is positioned between the first substrate 210 and the second substrate 310. The second substrate 310 includes a third surface S3 and a fourth surface S4 opposite to each other. The third surface faces the first surface of the first substrate 210 and includes a chip-receiving area A2 configured to attach the chips 220 from the first substrate 210.

The second substrate 310 includes a support layer 312 and a first adhesive layer 314. In an embodiment where the second substrate 310 is a double-layer structure composed of the support layer 312 and the first adhesive layer 314, the third surface S3 of the second substrate 310 is located on the first adhesive layer 314 and the fourth surface S4 of the second substrate 310 is located under the support layer 312. In some embodiments, the support layer 312 may include a glass substrate, a silicon substrate, a sapphire substrate, a thin film transistor (TFT) substrate, or other suitable substrates. In some embodiments, the first adhesive layer 314 may include epoxy, silicone, polyimide (PI), poly(methyl 2-methylpropenoate) (PMMA), or other suitable adhesive materials.

A flatness of the first substrate 210 may affect a transfer rate of the chips 220 transferring from the first substrate 210 to the second substrate 310. If the first substrate 210 with less flatness, the chips 220 disposed on the first substrate 210 may not effectively touch the chip-receiving area A2 of the second substrate 310, or a chemical reaction in later laser lift-off (LLO) process may not occur as expected causing the chips 220 not to detach from first substrate 210. A non-uniform stress induced by external force, operation temperature, or heterogeneous materials (e.g., the chips 220) disposed on the first substrate 210 may deform the first substrate 210, such as warpage of the first substrate 210. To increase the flatness of the first substrate 210, forming a patterned recess 300 on the first substrate 210 may help relieve the non-uniform stress exerting on the first substrate 210 and prevent the first substrate from deforming.

In some embodiments, a patterned recess 300 is formed on the second surface S2 of the first substrate 210 after step S120.

The patterned recess 300 on the second surface S2 may have a projection area A3 on the first surface S1. Because the patterned recess 300 of the first substrate 210 can be arranged according to various product designs or process requirements, the projection area A3 of the patterned recess 300 on the first surface S1 may partly overlap with the chip-connecting area A1. In some embodiments, the projection area A3 on the first surface S1 is spaced apart from the chips 220 disposed on the first surface to ensure that every single chip 220 can be situated in substantially the same process conditions for favorable consistency of the chips 220. In another words, the projection area A3 may not overlap with the chip-connecting area A1.

The patterned recess 300 can include a trench 320 on the second surface S2. In some embodiments, the trench 320 may not pass through the first substrate 210, as illustrated in FIGS. 3A and 3B. That is, a depth 320D of the trench 320 is less than a thickness 210D of the first substrate 210. In some embodiments, the depth 320D of the trench 320 may be about 20% to about 80% of the thickness 210D of the first substrate 210, such as about 20%, 30%, 40%, 50%, 60%, 70% and 80% of the thickness 210D. In some embodiments, the depth 320D of the trench 320 may be about 50% of the thickness 210D of the first substrate 210.

The patterned recess 300 may be formed by engraving or cutting the second surface S2 of the first substrate 210. In some embodiments, a laser technique, a lithography process, or mechanical technique can be used to engrave the second surface S2 of the first substrate 210 for the patterned recess 300. The laser may include a picosecond-based laser, a femtosecond-based laser, an excimer laser, or any suitable lasers with adjustable laser depth. In some embodiments, the laser from a laser source (not illustrated) may be focused on the first substrate 210 to form the patterned recess 300. Specifically, the laser with high energy density focuses on a specific spot and heats a material of the first substrate 210 at the specific spot to melting or boiling point of the material, thereby removing the material to cut or pattern the first substrate 210.

In some embodiments, the patterned recess 300 may be formed after step S120. In some other embodiments, the patterned recess 300 may be formed before step S120. In another words, the patterned recess 300 can be formed on the second surface S2 of the first substrate 210 either before or after step S120.

Figure 4A:
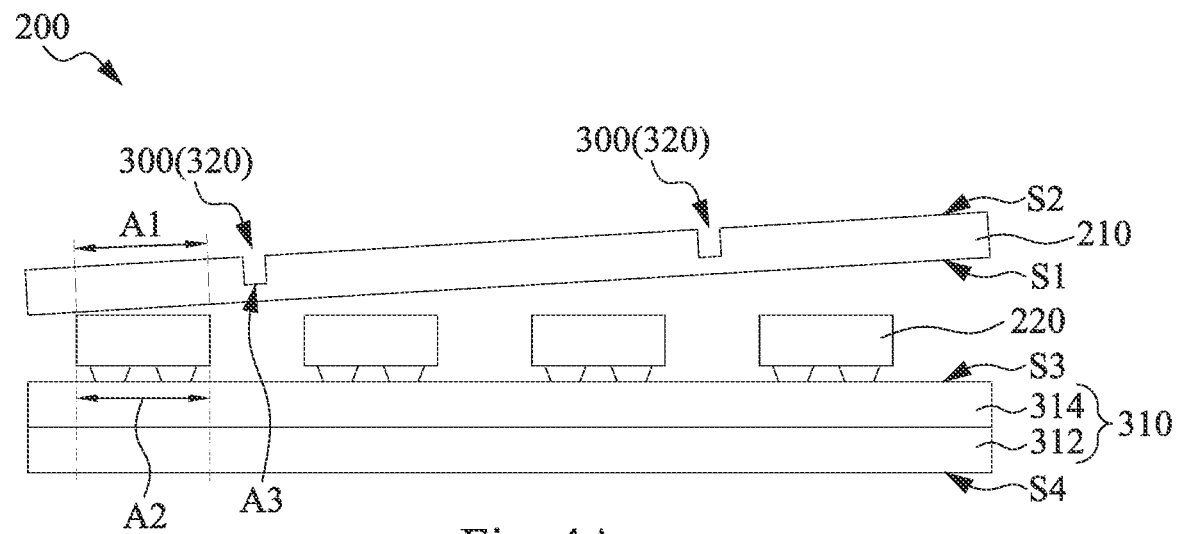
FIG. 4A is a side view of a device of mass transferring chips in an intermediate stage, in accordance with some embodiments.
Figure 4B:
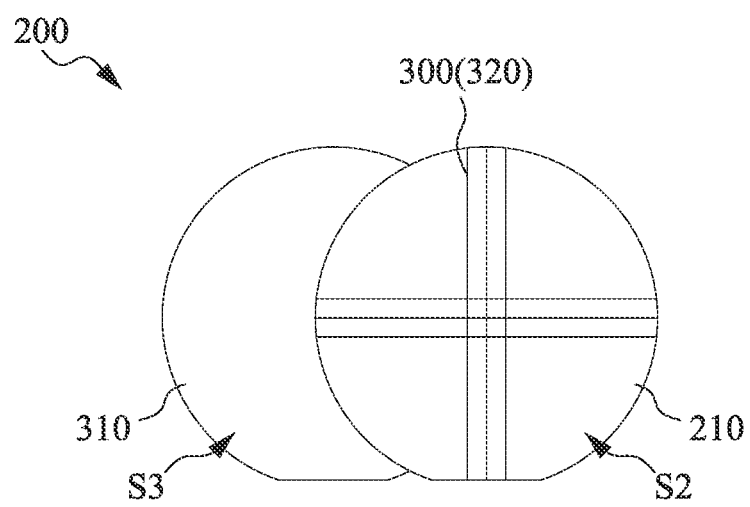
FIG. 4B is a top view of a device of mass transferring chips in an intermediate stage, in accordance with some embodiments.

Referring to FIGS. 1, 4A and 4B, FIG. 4A is a side view of the device 200 of mass transferring the chips 220 in an intermediate stage in accordance with some embodiments, and FIG. 4B is a top view of the device 200 of mass transferring the chips 220 in an intermediate stage in accordance with some embodiments.

In step S140, the first substrate 210 is removed. In some embodiments, the first substrate 210 can be removed by using a laser lift-off method, a photochemical reaction method or a photophysical reaction method. In some embodiments of using the laser lift-off method, a selected laser source may, for example, emit a KrF excimer laser with wavelength of 248 nanometers (nm), emit a diode-pumped solid-state (DPSS) laser with wavelength of 266 nm, or emit a DPSS laser with wavelength of 355 nm, but the present disclosure is not limited thereto.

In the laser lift-off (LLO) process, because laser energy is relatively high, semiconductor materials in the chip 220 will conduct a reduction reaction after receiving the laser energy. Specifically, in the present embodiment of the exemplary chip 220, as GaN of the undoped semiconductor layer 238 (e.g., undoped GaN layer) reacts with the laser, a gallium (Ga) metal and nitrogen ($N_2$) gas are produced. In some embodiments, nitrogen can help the chip 220 detach from the first substrate 210 and attach onto the second substrate 310. Nitrogen escapes to the atmosphere during the reduction reaction.

If the LLO process is performed on the first substrate 210 with less flatness, nitrogen may not escape to the atmosphere effectively, thereby preventing detachment of the chip 220 from the first substrate 210. In some embodiments, the uneven first substrate 210 may locally form an enclosed space which surrounded by the first substrate 210, the second substrate 310 or the chip 220. Nitrogen in the above-mentioned enclosed space may not escape to the atmosphere effectively and the concentration of nitrogen may accumulate. According to Le Chatelier's principle (i.e., equilibrium law), the reduction reaction may not continue due to high concentration of nitrogen, thereby preventing the chip 220 from transferring from the first substrate 210 to the second substrate 310.

Therefore, the formation of the patterned recess 300 to increase the flatness of the first substrate 210 may help the chips 220 touch the chip-receiving area A2 of the second substrate 310, or reduce an accumulation of nitrogen between the first substrate 210 and the second substrate 310, thereby helping the chemical reaction in later laser lift-off (LLO) process occur as expected to detach the chips 220 from first substrate 210.

Figure 5A:
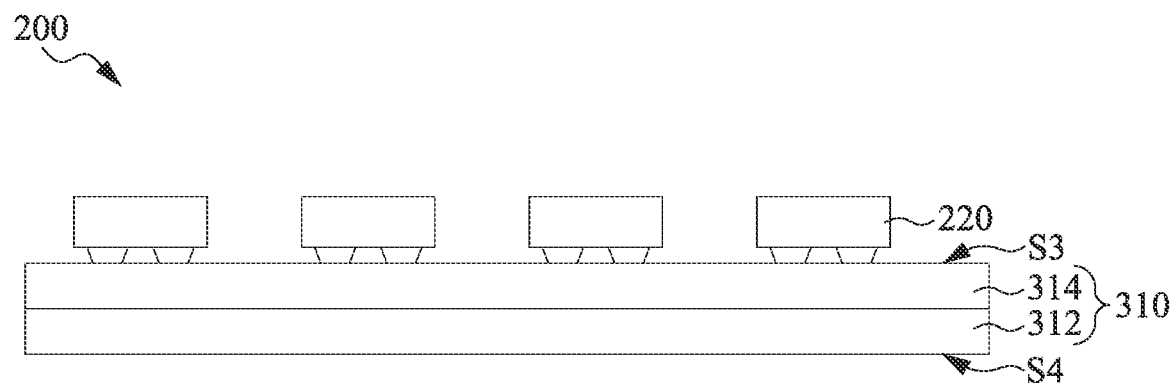
FIG. 5A is a side view of a device of mass transferring chips in an intermediate stage, in accordance with some embodiments.
Figure 5B:
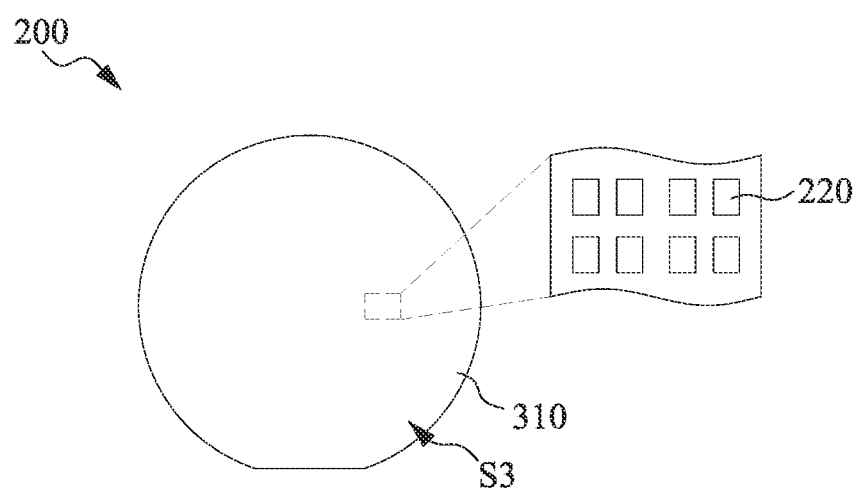
FIG. 5B is a top view of a device of mass transferring chips in an intermediate stage, in accordance with some embodiments.

Referring to FIGS. 1, 5A and 5B, FIG. 5A is a side view of the device 200 of mass transferring the chips 220 in an intermediate stage in accordance with some embodiments, and FIG. 5B is a top view of the device 200 of mass transferring the chips 220 in an intermediate stage in accordance with some embodiments.

In step S160, the chips 220 are left on the second substrate 310. Specifically, after transferring, the chips 220 are disposed on the third surface S3 of the first adhesive layer 314 of the second substrate 310.

In some embodiments, if the LLO process is implemented, nitrogen may escape to the atmosphere during the reduction reaction and the generated Ga metal may be removed in step S160. For example, the Ga metal may be dissolved by an acidic solution or acidic gas. In some embodiments, the acid solution may be hydrochloric acid (HCl) solution, and the present disclosure is not limited thereto. In some other embodiments, use of different acid solutions may be selected based on different generated metals.

In the device 200 of mass transferring the chips 220, the formation of the patterned recess 300 on the second surface S2 of the first substrate 210 to increase the flatness of the first substrate 210 can enhance the transfer rate of the chips 220. In addition to the second surface S2 of the first substrate 210, the patterned recess 300 can be formed on the first surface S1 of the first substrate 210. Moreover, the patterned recess 300 may include a blind hole (e.g., trench) or a through hole. The through hole connects the first surface S1 and the second surface S2.

It is understood that the following embodiments only illustrate the formation of the patterned recess 300. Further, the patterned recess 300 may be formed before step S120 or between step S120 and step S140. Other steps in FIG. 1 are as described previously, and thus no further descriptions are elaborated therein.

Figure 6A:
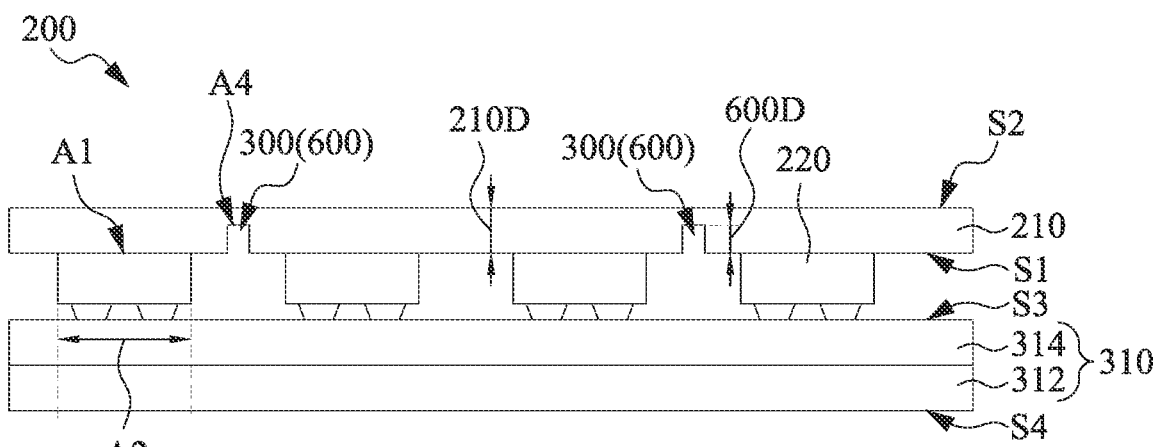
FIG. 6A is a side view of a device of mass transferring chips in an intermediate stage, in accordance with some embodiments.
Figure 6B:
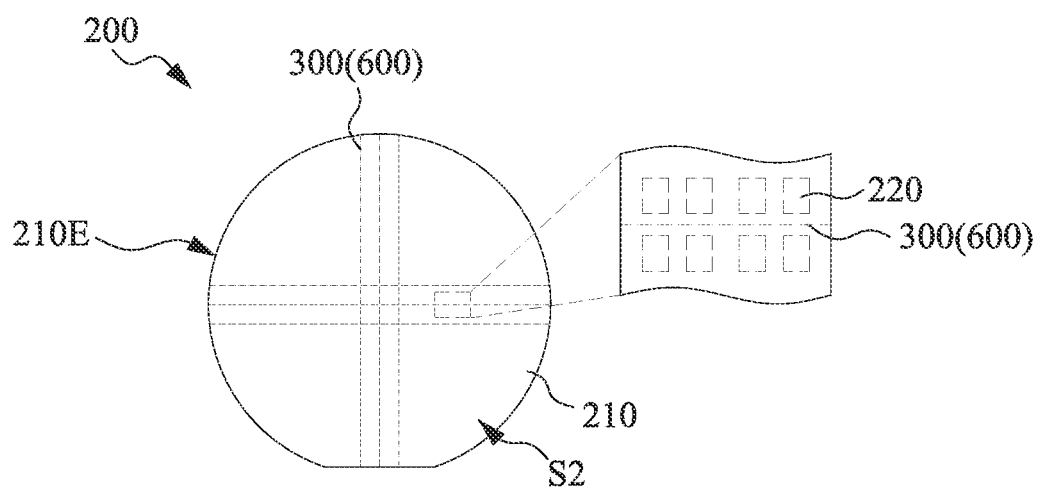
FIG. 6B is a top view of a device of mass transferring chips in an intermediate stage, in accordance with some embodiments.

Referring to FIGS. 1, 6A and 6B, FIG. 6A is a side view of the device 200 of mass transferring the chips 220 in an intermediate stage in accordance with some embodiments, and FIG. 6B is a top view of the device 200 of mass transferring the chips 220 in an intermediate stage in accordance with some embodiments. It is noted that, in the top view of FIG. 6B, the chips 220 and the patterned recess 300 on the first surface S1 cannot be observed since the observation direction is for observing the second surface S2. Therefore, the exemplary positions of the chips 220 and the patterned recess 300 on the first surface S1 are indicated with different broken lines in the second surface S2.

After step S120, the first surface S1 of the first substrate 210 may face the second substrate 310, and the second surface S2 of the first substrate 210 may be exposed. In some embodiments as illustrated in FIGS. 6A and 6B, the patterned recess 300 is formed on the first surface S1 of the first substrate 210. In another words, the patterned recess 300 and the chip-connecting area A1 configured to connect the chips 220 are positioned on the same side, and thus between the first substrate 210 and the second substrate 310.

Though the patterned recess 300 and the chip-connecting area A1 are on the same side (e.g., the first surface S1), the patterned recess 300 and the chips 220 can be spaced apart from each other for favorable consistency of the chips 220. In another words, an area A4 of the patterned recess 300 and the chip-connecting area A1 may not overlap each other.

The patterned recess 300 can include a trench 600 on the first surface S1. In some embodiments, the trench 600 may not pass through the first substrate 210, as illustrated in FIGS. 6A and 6B. That is, a depth 600D of the trench 600 is less than a thickness 210D of the first substrate 210. In some embodiments, the depth 600D of the trench 600 may be about 20% to about 80% of the thickness 210D of the first substrate 210, such as about 20%, 30%, 40%, 50%, 60%, 70% and 80% of the thickness 210D. In some embodiments, the depth 600D of the trench 600 may be about 50% of the thickness 210D of the first substrate 210.

In the case where the trench 600 extends to a side surface 210E of the first substrate 210, the trench 600 may also serve as a gas-releasing channel. In the LLO process to remove the first substrate 210 (e.g., step S140), nitrogen can be directed along the trench 600 to the side surface 210E and escape to the atmosphere accordingly. Without the accumulation of nitrogen between the first substrate 210 and the second substrate 310, the reduction reaction in the LLO process can occur as expected, thereby increasing the transfer rate of the chips 220.

The patterned recess 300 may be formed by engraving or cutting the first surface S1 of the first substrate 210. Method used to engrave the first surface S1 of the first substrate 210 is substantially same as the method used to engrave the second surface S2 of the first substrate 210, and thus no further descriptions are elaborated therein.

However, an engraving process cannot be performed on the first surface S1 after step S120 since the first surface S1 is not exposed. Consequently, the engraving process can only be performed on the first surface S1 before step S120.

Figure 7A:
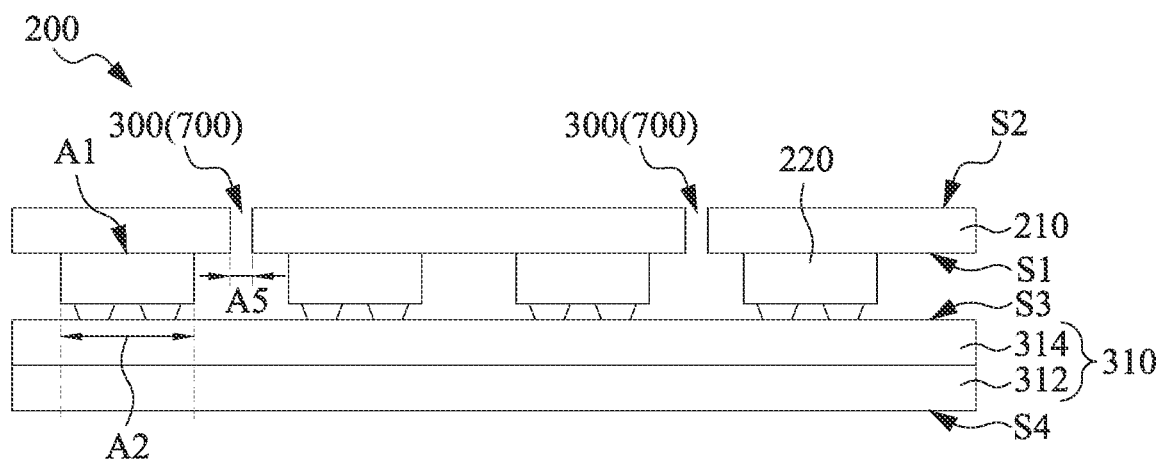
FIG. 7A is a side view of a device of mass transferring chips in an intermediate stage, in accordance with some embodiments.
Figure 7B:
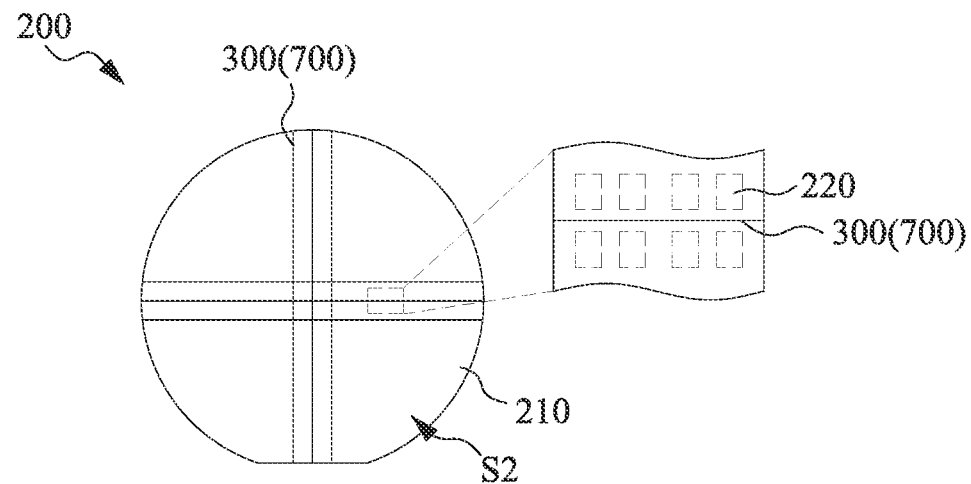
FIG. 7B is a top view of a device of mass transferring chips in an intermediate stage, in accordance with some embodiments.

Referring to FIGS. 1, 7A and 7B, FIG. 7A is a side view of the device 200 of mass transferring the chips 220 in an intermediate stage in accordance with some embodiments, and FIG. 7B is a top view of the device 200 of mass transferring the chips 220 in an intermediate stage in accordance with some embodiments. It is noted that, in the top view of FIG. 7B, the chips 220 disposed on the first surface S1 cannot be observed due to the observation direction for observing the second surface S2. Therefore, the exemplary positions of the chips 220 disposed on the first surface S1 are indicated with broken lines in the second surface S2.

It is understood that the following embodiments only illustrate the formation of the patterned recess 300. Further, the patterned recess 300 may be formed before step S120 or between step S120 and step S140. Other steps in FIG. 1 are as described previously, and thus no further descriptions are elaborated therein.

In FIGS. 7A and 7B, the patterned recess 300 can include a patterned through hole 700, connecting the first surface S1 and the second surface S2. That is, the patterned through hole 700 passes through the first substrate 210. A position of the patterned through hole 700 on the first surface S1 can be spaced apart from the chips 220 for favorable consistency of the chips 220. In another words, an area A5 of the patterned through hole 700 and the chip-connecting area A1 may not overlap each other. The patterned through hole 700 can be formed by a laser technique, a lithography process, mechanical technique or any suitable techniques. In some embodiments, the patterned through hole 700 can be formed by similar methods of engraving the first substrate 210.

The patterned through hole 700 can also serve as a gas-releasing channel. In the LLO process to remove the first substrate 210 (e.g., step S140), nitrogen can be directed along the patterned through hole 700 from the first surface S1 to the second surface S2 and escape to the atmosphere accordingly. Without the accumulation of nitrogen between the first substrate 210 and the second substrate 310, the reduction reaction in the LLO process can occur as expected, thereby increasing the transfer rate of the chips 220.

In the embodiments as illustrated in FIGS. 3A, 3B, 6A, 6B, 7A and 7B, the patterned recess 300 can be formed on the first surface S1 or the second surface S2. That is, the patterned recess 300 can include the trench 320 on the second surface S2, the trench 600 on the first surface S1, a patterned through hole 700 connecting the first surface S1 and the second surface S2, or a combination thereof. When the patterned recess 300 is the trench 320/600, the depth of the patterned recess 300 may be about 20% to about 80% of the thickness 210D of the first substrate 210.

Referring to FIGS. 8A-8D, FIGS. 8A-8D are exemplary patterns of the patterned recess 300 of the first substrate 210 in accordance with some embodiments. The exemplary patterns in FIGS. 8A-8D can be combined to each other to form any suitable patters of the patterned recess 300. The patterned recess 300 may include a blind hole (e.g., trench) or a through hole. When the patterned recess 300 includes the blind hole (e.g., trench), the patterned recess 300 may be positioned on the first surface S1 or the second surface S2.

Figure 8A:
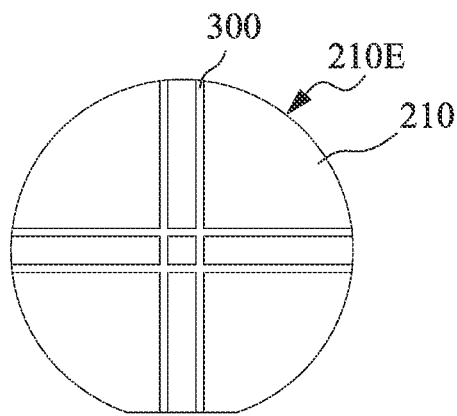
FIGS. 8A-8D are exemplary patterns of a patterned recess of a first substrate, in accordance with some embodiments.
Figure 8B:
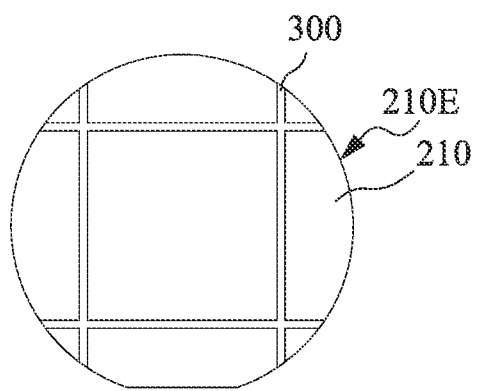

The patterned recess 300 with a first pattern illustrated in FIG. 8A can extend across a center zone of the first substrate 210 and be connected to the side surface 210E of the first substrate 210. The patterned recess 300 with the first pattern illustrated in FIG. 8A may include multiple line structures which cross each other. One or more chips 220 may be disposed on an area surrounded by the crossing line structures. The patterned recess 300 with a second pattern illustrated in FIG. 8B can extend across the first substrates and reach the side surface 210E without passing through the center zone of the first substrate 210. Similar to the first pattern illustrated in FIG. 8A, the patterned recess 300 with the second pattern illustrated in FIG. 8B may also include multiple line structures which cross each other. One or more chips 220 may similarly be disposed on an area surrounded by the crossing line structures.

Figure 8C:
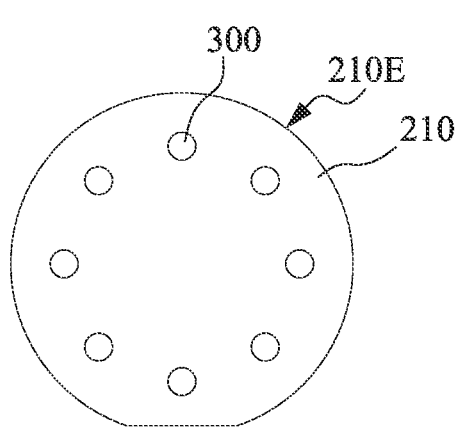
Figure 8D:
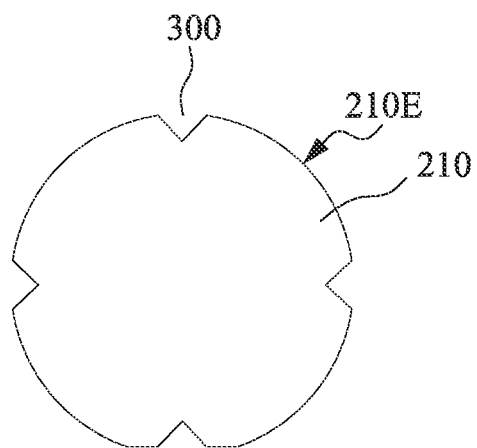

The patterned recess 300 may have a first scattered pattern on the first substrate 210 as illustrated in FIG. 8C. In some embodiments, the patterned recess 300 with the first scattered pattern illustrated in FIG. 8C may not be connected to the side surface 210E of the first substrate 210. The patterned recess 300 may have a second scattered pattern on the first substrate 210 as illustrated in FIG. 8D. Different from the first pattern illustrated in FIG. 8C, the second scattered pattern of the patterned recess 300 is positioned at the side surface 210E. Based on the present disclosure herein, the patterned recess 300 with any other patterns for relieving the stress or releasing gas are within the spirit and scope of the present disclosure.

In the device 200 of mass transferring the chips 220, the patterned recess 300 is formed on the first substrate 210. In some embodiments, the patterned recess 300 can be formed on the second substrate 310 to increase the transfer rate of the chips 220.

It is understood that the following embodiments only illustrate the formation of a patterned recess (e.g., a patterned recess 900). Further, the patterned recess may be formed before step S120 or between step S120 and step S140. Other steps in FIG. 1 are as described previously, and thus no further descriptions are elaborated therein.

Figure 9A:
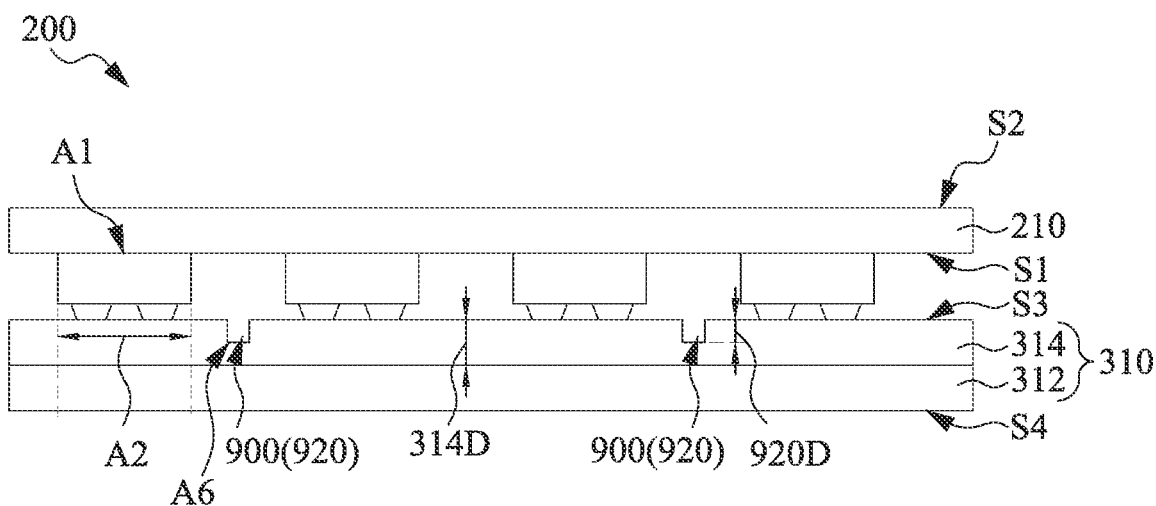
FIG. 9A is a side view of a device of mass transferring chips in an intermediate stage, in accordance with some embodiments.
Figure 9B:
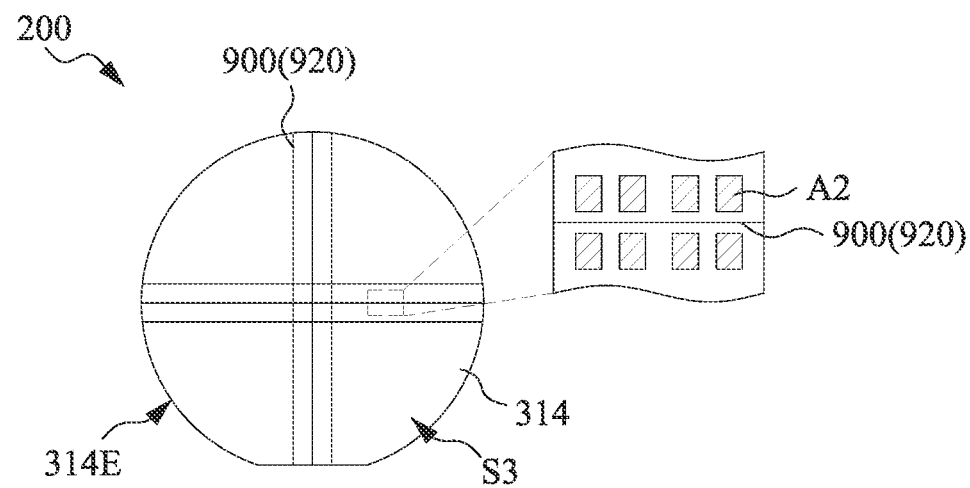
FIG. 9B is a top view of a second substrate disposed in a device of mass transferring chips in an intermediate stage, in accordance with some embodiments.

Referring to FIGS. 1, 9A and 9B, FIG. 9A is a side view of the device 200 of mass transferring the chips 220 in an intermediate stage in accordance with some embodiments, and FIG. 9B is a top view of the second substrate 310 disposed in the device 200 of mass transferring the chips 220 in an intermediate stage in accordance with some embodiments.

After step S120, the first surface S1 of the first substrate 210 may face the third surface S3 of the second substrate 310, and the fourth surface S4 may be exposed. In some embodiments as illustrated in FIGS. 9A and 9B, a patterned recess 900 is formed on the third surface S3 of the second substrate 310. In another words, the patterned recess 900 and the chip-receiving area A2 configured to attach the chips 220 are positioned on the same side (e.g., the third surface S3), and thus the patterned recess 900 and the chip-receiving area A2 are between the first substrate 210 and the second substrate 310. In some embodiments, the patterned recess 900 and the chips 220 can be spaced apart from each other on the third surface S3 for favorable consistency of the chips 220. In another words, an area A6 of the patterned recess 900 and the chip-receiving area A2 may not overlap each other.

The patterned recess 900 can include a trench 920 on the third surface S3. In some embodiments, the trench 920 may not pass through the first adhesive layer 314 of the second substrate 310, as illustrated in FIGS. 9A and 9B. That is, a depth 920D of the trench 920 is less than a thickness 314D of the first adhesive layer 314. In some embodiments, the depth 920D of the trench 920 may be about 20% to about 80% of the thickness 314D of the first adhesive layer 314, such as about 20%, 30%, 40%, 50%, 60%, 70% and 80% of the thickness 314D. In some embodiments, the depth 920D of the trench 920 may be about 50% of the thickness 314D of the first adhesive layer 314.

In some embodiments, the trench 920 on the third surface S3 may be connected to a side surface 314E of the first adhesive layer 314. The trench 920 on the third surface S3 may serve as a gas-releasing channel. In the LLO process to remove the first substrate 210 (e.g., step S140), nitrogen can be directed along the trench 920 to the side surface 314E of the first adhesive layer 314 and escape to the atmosphere accordingly. Without the accumulation of nitrogen between the first substrate 210 and the second substrate 310, the reduction reaction in the LLO process can occur as expected, thereby increasing the transfer rate of the chips 220.

The trench 920 of the patterned recess 900 may be formed by patterning the first adhesive layer 314 of the second substrate 310. In some embodiments, the trench 920 of the patterned recess 900 may be patterned by a laser technique, a lithography process, mechanical technique or any suitable techniques. In some embodiments where the lithography process is used, a patterned resist layer (not illustrated) may be formed on the first adhesive layer 314, and then an image of the patterned resist layer may be transferred to the first adhesive layer 314 by a suitable etchant removing a portion of the first adhesive layer 314 through the patterned resist layer, and then the patterned recess 900, thereby forming the patterned recess 900 on the first adhesive layer 314.

The patterning process cannot be performed on the third surface S3 if the third surface S3 is not exposed (e.g., after step S120). Consequently, the trench 920 of the patterned recess 900 can only be formed on the third surface S3 of the first adhesive layer 314 before step S120.

Figure 10A:
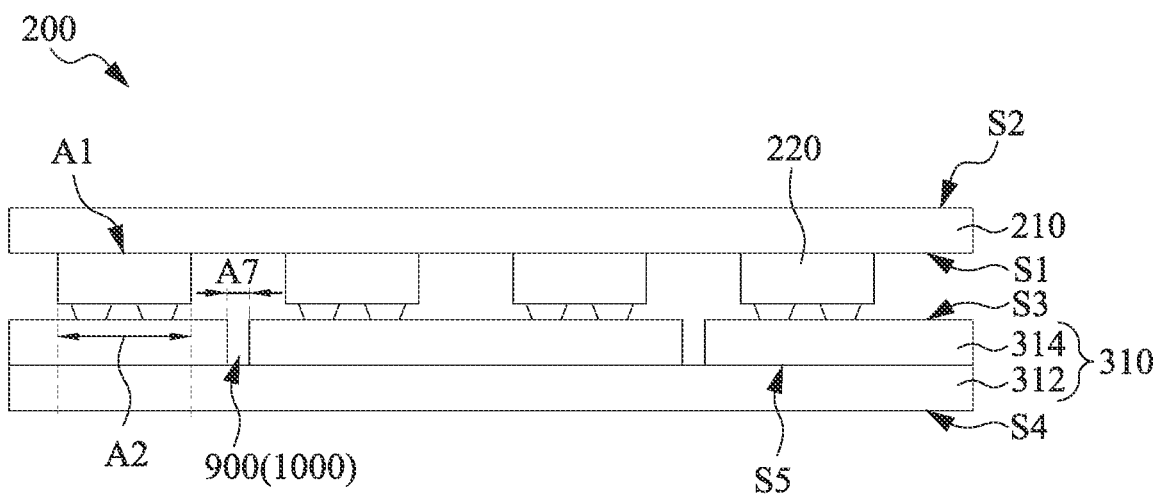
FIG. 10A is a side view of a device of mass transferring chips in an intermediate stage, in accordance with some embodiments.
Figure 10B:
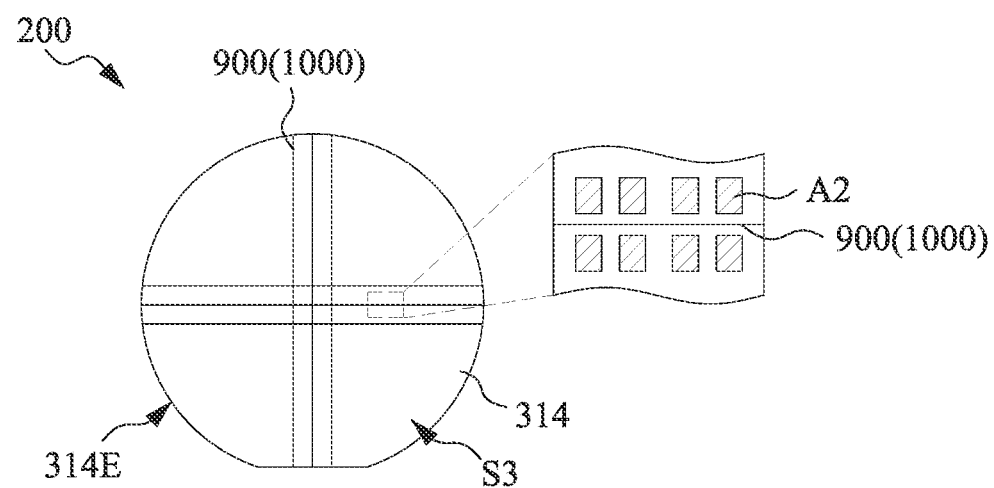
FIG. 10B is a top view of a second substrate disposed in a device of mass transferring chips in an intermediate stage, in accordance with some embodiments.

Referring to FIGS. 1, 10A and 10B, FIG. 10A is a side view of the device 200 of mass transferring the chips 220 in an intermediate stage in accordance with some embodiments, and FIG. 10B is a top view of the second substrate 310 disposed in the device 200 of mass transferring the chips 220 in an intermediate stage in accordance with some embodiments.

It is understood that the following embodiments only illustrate the formation of a patterned recess 900. Further, the patterned recess 900 may be formed before step S120 or between step S120 and step S140. Other steps in FIG. 1 are as described previously, and thus no further descriptions are elaborated therein.

In some embodiments, the first adhesive layer may include the third surface S3 and a fifth surface S5 opposite to each other, and the fifth surface S5 is in contact with the support layer 312. In FIGS. 10A and 10B, the patterned recess 900 can include a patterned through hole 1000 connecting the third surface S3 and the fifth surface S5 of the first adhesive layer 314. The patterned through hole 1000 passes through the first adhesive layer 314. A position of the patterned through hole 1000 on the third surface S3 can be spaced apart from the chips 220 for favorable consistency of the chips 220. In another words, an area A7 of the patterned through hole 1000 and the chip-receiving area A2 may not overlap each other.

In some embodiments, the patterned through hole 1000 may be connected to the side surface 314E of the first adhesive layer 314. In some other embodiments, a combination of the patterned through hole 1000 and the trench 920 may be used. The patterned through hole 1000 or the combination of the patterned through hole 1000 and the trench 920 may serve as a gas-releasing channel. In the LLO process to remove the first substrate 210 (e.g., step S140), nitrogen can be directed along the patterned through hole 1000 or the combination of the patterned through hole 1000 and the trench 920 to the side surface 314E of the first adhesive layer 314 and escape to the atmosphere accordingly. Without the accumulation of nitrogen between the first substrate 210 and the second substrate 310, the reduction reaction in the LLO process can occur as expected, thereby increasing the transfer rate of the chips 220.

The patterned through hole 1000 can be formed by a laser technique, a lithography process, mechanical technique or any suitable techniques. In some embodiments, the patterned through hole 1000 can be formed by similar methods of patterning the first adhesive layer 314 as previously described. The patterning process cannot be performed on the third surface S3 if the third surface S3 is not exposed (e.g., after step S120). Consequently, the patterned through hole 1000 can only be formed in the first adhesive layer 314 before step S120.

Referring to FIGS. 11A-11D, FIGS. 11A-11D are exemplary patterns of the patterned recess 900 of the first adhesive layer 314 in accordance with some embodiments. The exemplary patterns in FIGS. 11A-11D can be combined to each other to form any suitable patterns of the patterned recess 900. The patterned recess 900 may include a blind hole (e.g., the trench 920), a through hole (e.g., the patterned through hole 1000), or a combination thereof.

Figure 11A:
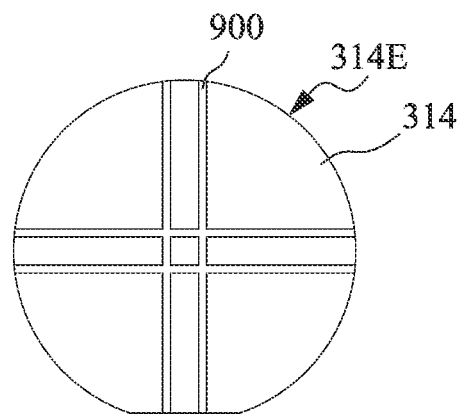
FIGS. 11A-11D are exemplary patterns of a patterned recess of a second substrate, in accordance with some embodiments.
Figure 11B:
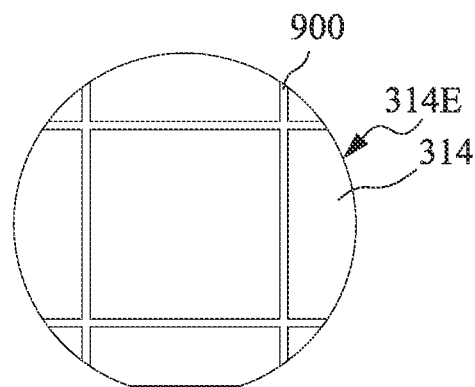

The patterned recess 900 with a first pattern illustrated in FIG. 11A can extend across a center zone of the first adhesive layer 314 and be connected to the side surface 314E of the first adhesive layer 314. The patterned recess 900 with the first pattern illustrated in FIG. 11A may include multiple line structures which cross each other. One or more chip-receiving area A2 may be located within an area surrounded by the crossing line structures. The patterned recess 900 with a second pattern illustrated in FIG. 11B can extend across the first adhesive layer 314 and reach the side surface 314E without passing through the center zone of the first adhesive layer 314. Similar to the first pattern illustrated in FIG. 11A, the patterned recess 900 with the second pattern illustrated in FIG. 11B may also include multiple line structures which cross each other. One or more chip-receiving area A2 may similarly be located within an area surrounded by the crossing line structures.

Figure 11C:
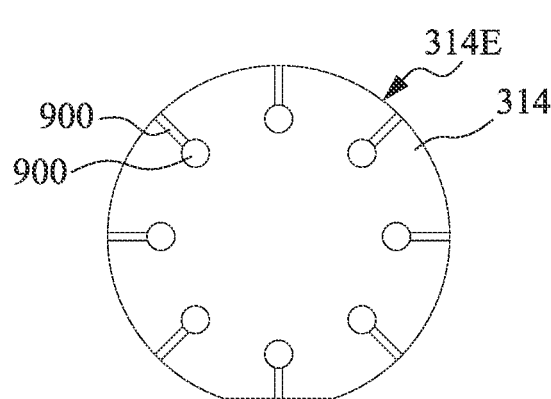
Figure 11D:
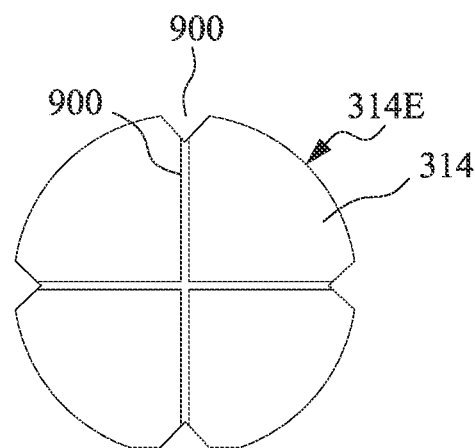

The patterned recess 900 may have a first scattered pattern and the line structures on the first adhesive layer 314 as illustrated in FIG. 11C. In some embodiments, the line structures may connect the first scattered pattern and the side surface 314E of the first adhesive layer 314 to direct nitrogen to the side surface 314E for escaping. The patterned recess 900 may have a second scattered pattern on the first adhesive layer 314 as illustrated in FIG. 11D. Different from the first pattern illustrated in FIG. 11C, the second scattered pattern of the patterned recess 900 is positioned at the side surface 314E. In some embodiments as illustrated in FIG. 11D, the patterned recess 900 may further have the line structures, which may be connected to the second scattered pattern. In some embodiments, the line structures connected to the second scattered pattern may extend across a proximity to a center of the first adhesive layer 314 in order to release nitrogen produced around the center of the first adhesive layer 314. Based on the present disclosure herein, the patterned recess 900 with any other patterns for relieving the stress or releasing gas are within the spirit and scope of the present disclosure.

Figure 12A:
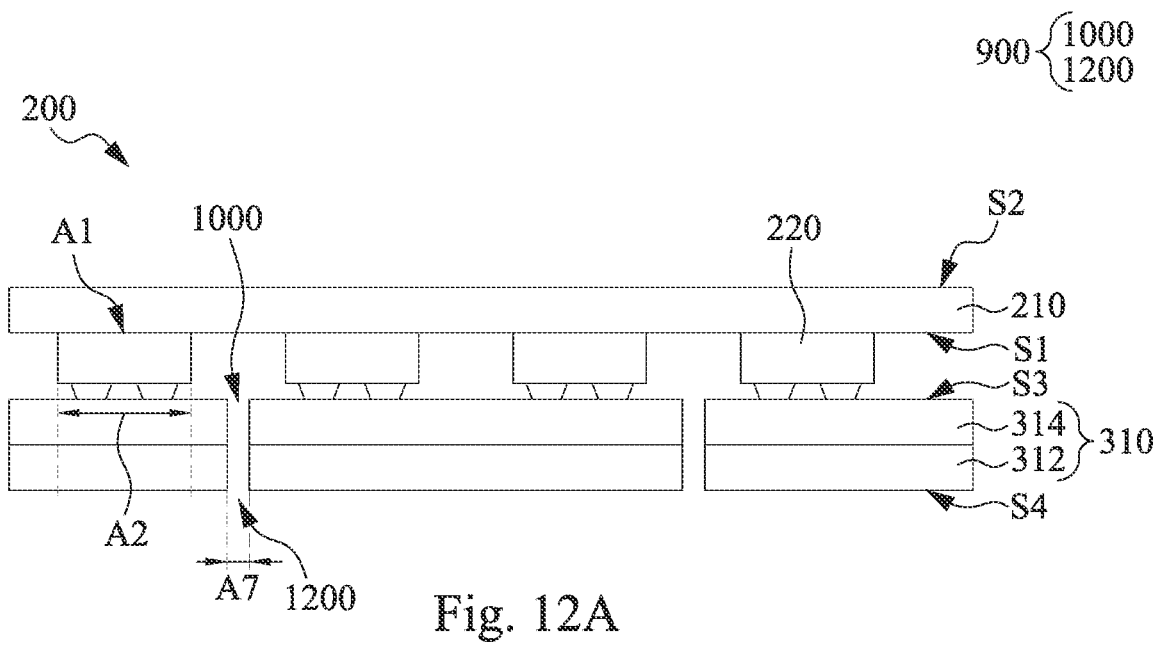
FIG. 12A is a side view of a device of mass transferring chips in an intermediate stage, in accordance with some embodiments.
Figure 12B:
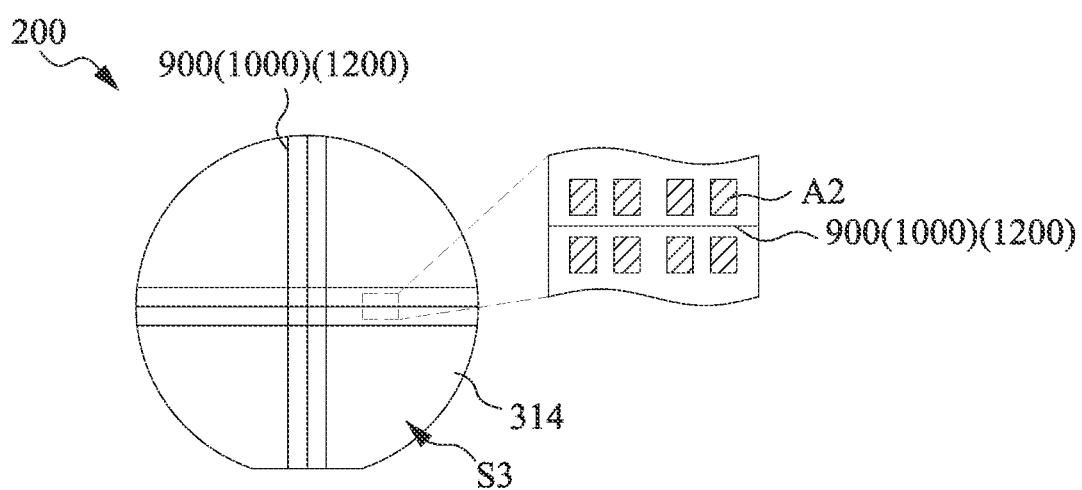
FIG. 12B is a top view of a second substrate disposed in a device of mass transferring chips in an intermediate stage, in accordance with some embodiments.

Referring to FIGS. 1, 12A and 12B, FIG. 12A is a side view of the device 200 of mass transferring the chips 220 in an intermediate stage in accordance with some embodiments, and FIG. 12B is a top view of the second substrate 310 disposed in the device 200 of mass transferring the chips 220 in an intermediate stage in accordance with some embodiments.

It is understood that the following embodiments only illustrate the formation of the patterned recess 300. Further, the patterned recess 300 may be formed before step S120 or between step S120 and step S140. Other steps in FIG. 1 are as described previously, and thus no further descriptions are elaborated therein.

In some embodiments as illustrated in FIGS. 12A and 12B, the patterned recess 900 may include the patterned through hole 1000 in the first adhesive layer 314 and a patterned through hole 1200 in the support layer 312. The patterned through hole 1000 passes through the first adhesive layer 314 and the patterned through hole 1200 passes through the support layer 312. The position of the patterned through hole 1000 on the third surface S3 is spaced apart from the chips 220. In another words, the area A7 of the patterned through hole 1000 and the chip-receiving area A2 may not overlap each other.

In the LLO process to remove the first substrate 210 (e.g., step S140), nitrogen can be directed along the patterned through hole 1000 and the patterned through hole 1200 and escape to the atmosphere accordingly. Without the accumulation of nitrogen between the first substrate 210 and the second substrate 310, the reduction reaction in the LLO process can occur as expected, thereby increasing the transfer rate of the chips 220.

In some embodiments, the patterned through hole 1000 and the patterned through hole 1200 may be formed by the same process. Therefore, the patterned through hole 1000 can be positioned in alignment with the patterned through hole 1200. The patterned through hole 1000 and the patterned through hole 1200 may be patterned by a laser technique, a lithography process, mechanical technique or any suitable techniques.

The process of forming patterned through hole 1000 and the patterned through hole 1200 cannot be performed on the third surface S3 after step S120 since the third surface S3 is not exposed. Consequently, the process of forming patterned through hole 1000 in the first adhesive layer 314 and the patterned through hole 1200 in the support layer 312 can only be performed before step S120.

Referring to FIGS. 13A-13D, FIGS. 13A-13D are exemplary patterns of the patterned recess 900 of the second substrate 310 in accordance with some embodiments, particularly for the patterned through hole 1000 in the first adhesive layer 314 and the patterned through hole 1200 in the support layer 312. The exemplary patterns in FIGS. 13A-13D can be combined to each other to form any suitable patterns of the patterned recess 900. The patterned recess 900 may further include a blind hole (e.g., the trench 920) on the second substrate 310.

Figure 13A:
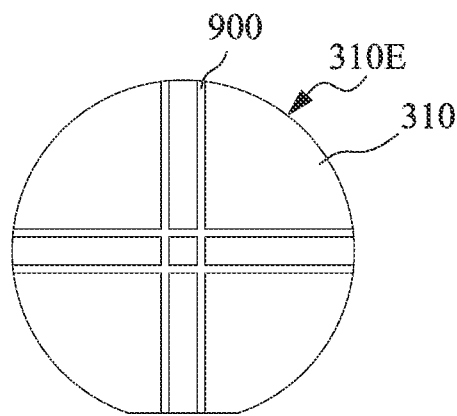
FIGS. 13A-13D are exemplary patterns of a patterned recess of a second substrate, in accordance with some embodiments.
Figure 13B:
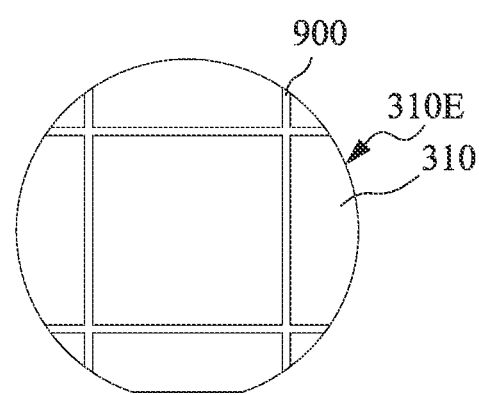

The patterned recess 900 with a first pattern illustrated in FIG. 13A can extend across a center zone of the second substrate 310 and be connected to the side surface 310E of the second substrate 310. The patterned recess 900 with the first pattern illustrated in FIG. 13A may include multiple line structures which cross each other. One or more chip-receiving area A2 may be located within an area surrounded by the crossing line structures. The patterned recess 900 with a second pattern illustrated in FIG. 13B can extend across the second substrate 310 and reach the side surface 310E without passing through the center zone of the second substrate 310. Similar to the first pattern illustrated in FIG. 13A, the patterned recess 900 with the second pattern illustrated in FIG. 11B may also include multiple line structures which cross each other. One or more chip-receiving area A2 may similarly be located within an area surrounded by the crossing line structures.

Figure 13C:
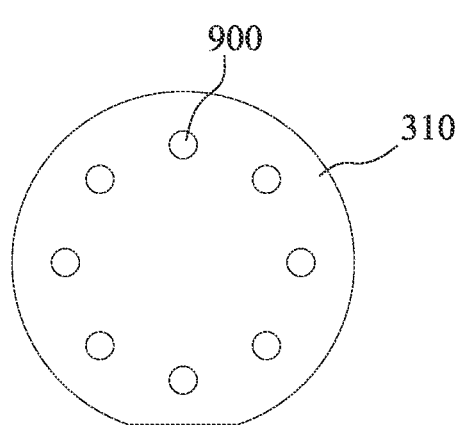
Figure 13D:
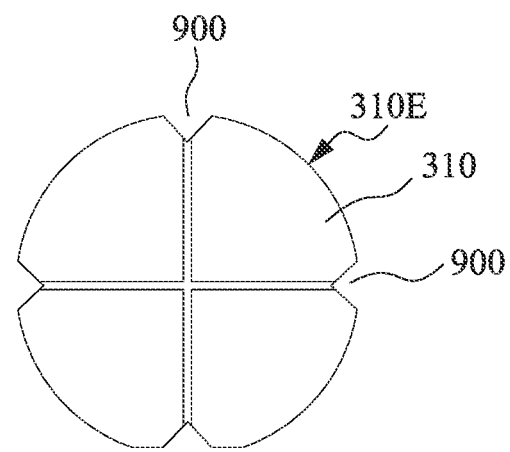

The patterned recess 900 may have a first scattered pattern on the second substrate 310 as illustrated in FIG. 13C. In some embodiments, nitrogen can escape to the atmosphere along the patterned through hole 1000 and the patterned through hole 1200. Therefore, compared to FIG. 11C, line structures may not be connected to the first scattered patterned illustrated in FIG. 13C for gas releasing. The patterned recess 900 may have a second scattered pattern on the second substrate 310 as illustrated in FIG. 13D. Different from the first pattern illustrated in FIG. 13C, the second scattered pattern of the patterned recess 900 is positioned at the side surface 310E. In some embodiments as illustrated in FIG. 13D, the patterned recess 900 may further have the line structures, which may be connected to the second scattered pattern. In some embodiments, the line structures connected to the second scattered pattern may extend across a proximity to a center of the second substrate 310 in order to release nitrogen produced around the center of the second substrate 310. Based on the present disclosure herein, the patterned recess 900 with any other patterns for relieving the stress or releasing gas are within the spirit and scope of the present disclosure.

Figure 14A:
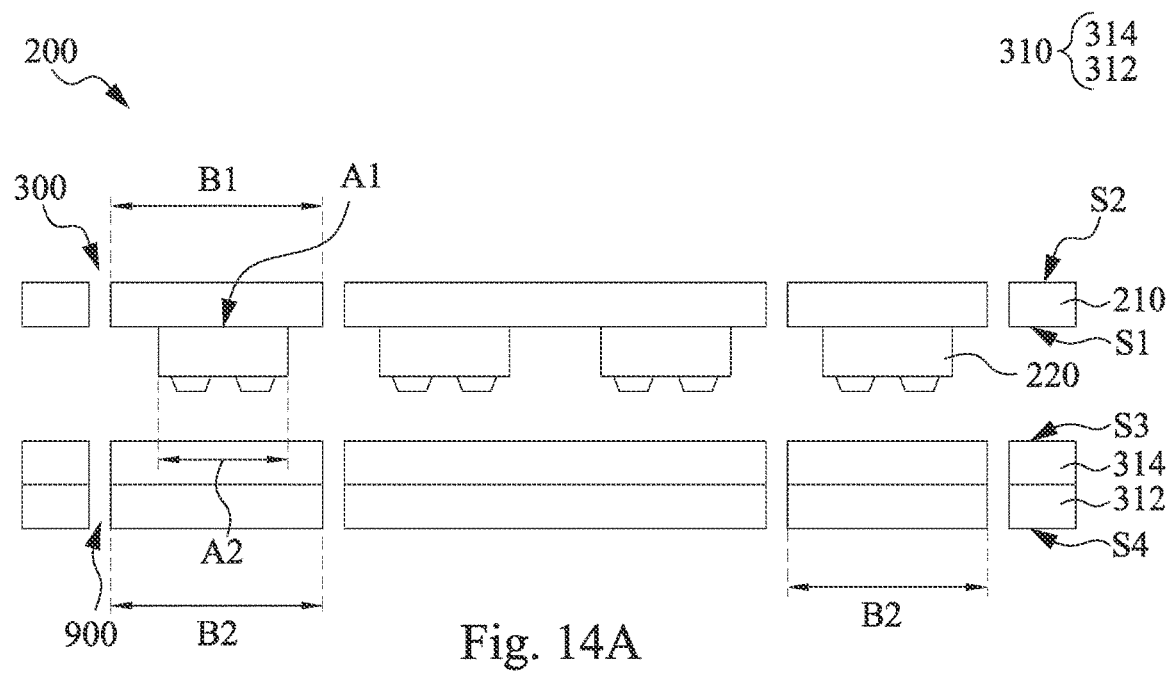
FIGS. 14A and 14B are side views of a device of mass transferring chips in an intermediate stage, in accordance with some embodiments.
Figure 14B:
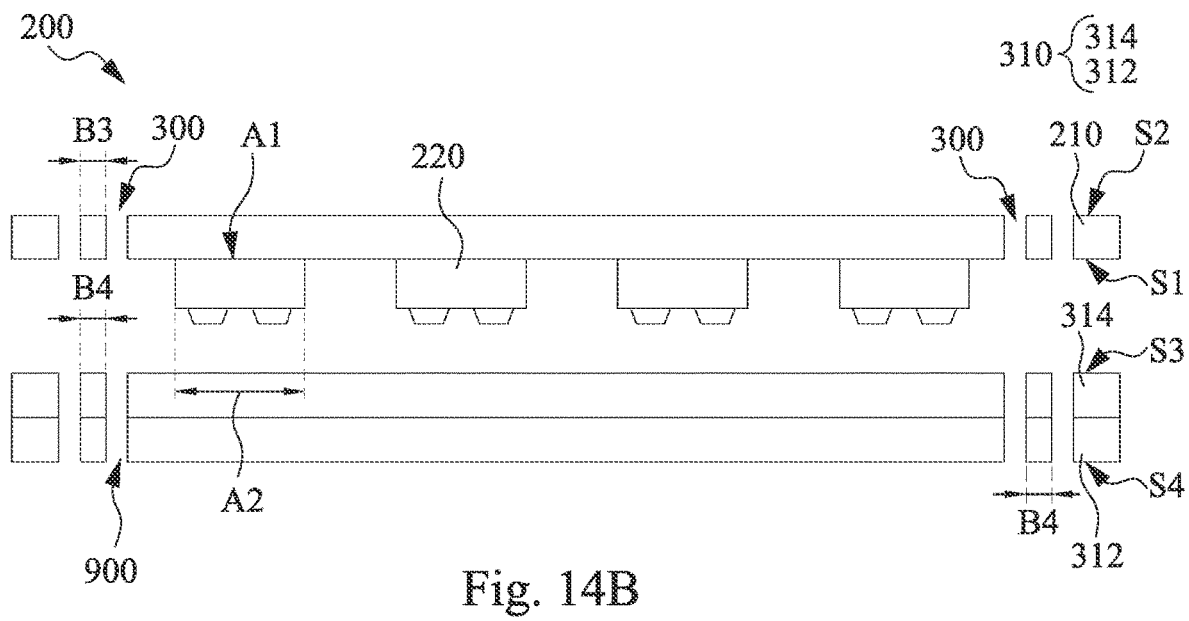

Referring to FIGS. 14A and 14B, FIGS. 14A and 14B are side views of the device 200 of mass transferring the chips 220 in an intermediate stage in accordance with some embodiments. In some embodiments, the device 200 of mass transferring the chips 220 may include the patterned recess 300 on the first substrate 210 and the patterned recess 900 on the second substrate 310 at the same time, thereby increasing the transfer rate of the chips 220. In some embodiments, the patterned recess 300 on the first substrate 210 may correspond to the patterned recess 900 on the second substrate 310. In some other embodiments, the patterned recess 300 on the first substrate 210 may not correspond to the patterned recess 900 on the second substrate 310.

It is understood that the following embodiments only illustrate the formation of the patterned recess 300/900. Further, the patterned recess 300/900 may be formed before step S120 or between step S120 and step S140. Other steps in FIG. 1 are as described previously, and thus no further descriptions are elaborated therein.

In FIG. 14A, when at least one chip 220 is disposed between two adjacent recesses of the patterned recess 300, an interval B1 between two adjacent recesses of the patterned recess 300 is larger than one chip-connecting area A1. Similarly, when at least one chip-receiving area A2 is located between two adjacent recesses of the patterned recess 900, an interval B2 between two adjacent recesses of the patterned recess 900 is larger than one chip-receiving area A2.

In FIG. 14B, when no chip 220 is disposed between two adjacent recesses of the patterned recess 300, an interval B3 between two adjacent recesses of the patterned recess 300 can be smaller than one chip-connecting area A1. Similarly, when no chip-receiving area A2 is located between two adjacent recesses of the patterned recess 900, an interval B4 between two adjacent recesses of the patterned recess 900 can be smaller than one chip-receiving area A2.

Figure 15:
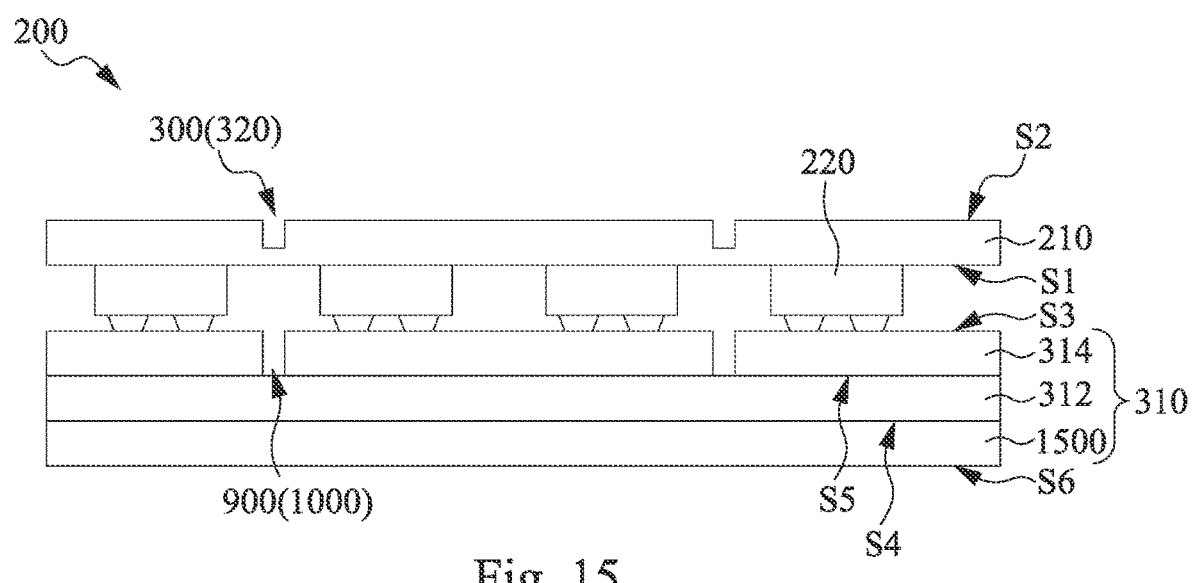
FIG. 15 is a side view of a device of mass transferring chips in an intermediate stage, in accordance with some embodiments.

Referring to FIG. 15, FIG. 15 is a side view of the device 200 of mass transferring the chips 220 in an intermediate stage in accordance with some embodiments. The device 200 may further include a second adhesive layer 1500. In some embodiments, the second substrates may be a three-layer structure composed of the support layer 312, the first adhesive layer 314 and the second adhesive layer 1500. For example, the first adhesive layer 314 and the second adhesive layer 1500 may be disposed on opposite sides of the support layer 312. The first adhesive layer 314 may include the third surface S3 and the fifth surface S5 opposite to each other. The third surface S3 may face the first surface S1 of the first substrate 210, and the fifth surface S5 may be in contact the support layer 312. The second adhesive layer 1500 may include the fourth surface S4 and a sixth surface S6 opposite to each other. The fourth surface S4 may physically contact the support layer 312. In some embodiments, the second adhesive layer 1500 can be combined with various embodiments described in the present disclosure. For example, in FIG. 15, the second adhesive layer 1500 is combined with the first substrate with the patterned recess 300 having the trench 320 and the first adhesive layer 314 with the patterned recess 900 having the patterned through hole 1000.

The second substrate 310 with a multilayer structure (e.g., the second substrate with double-layer structure as illustrated in FIG. 3A) can be formed by bonding heterogeneous materials. With different material properties such as coefficient of thermal expansion (CTE), the second substrate 310 may be uneven (e.g., warpage of the second substrate 310). For example, a first non-uniform stress due to the first adhesive layer disposed on one side of the second substrate 310 may deform the second substrate 310, such as make the second substrate 310 concave (two ends of the second substrate 310 upwards) (not illustrated). To decrease the deformation, the second adhesive layer 1500 may be disposed on the other opposite side of the second substrate 310 to offset the first non-uniform stress by, for example, making the second substrate 310 convex (two ends of the second substrate 310 downwards) (not illustrated). As a result, a flatness of the second substrate 310 can be increased.

In some embodiments, a thickness 1500D of the second adhesive layer 1500 is greater than the thickness 314D of the first adhesive layer 314. For example, a ratio of the thickness 1500D of the second adhesive layer 1500 to the thickness 314D of the first adhesive layer 314 is in a range of about 1.2 to about 1.5. In another words, thickness 1500D of the second adhesive layer 1500 is greater than the thickness 314D of the first adhesive layer 314 by about 20% to about 50% of the thickness 314D of the first adhesive layer 314. In some embodiments, the thickness 314D of the first adhesive layer 314 is from about 50 μm to about 100 μm, such as 50, 60, 70, 80, 90, or 100 μm. In some embodiments, the thickness 1500D of the second adhesive layer 1500 is from about 60 μm to about 150 μm, such as 60, 70, 80, 90, 100, 110, 120, 130, 140 or 150 μm.

Further, a material of the second adhesive layer 1500 may be different from a material of the first adhesive layer 314 for less influence of the second adhesive layer 1500 on the later LLO process. In some embodiments, the second adhesive layer 1500 may include epoxy, silicone, and the like. In some embodiments, the first adhesive layer 314 may include PI, PMMA, and the like. In an embodiment where the material of the second adhesive layer 1500 different from the material of the first adhesive layer 314, the second adhesive layer 1500 and the first adhesive layer 314 may responds differently, such as absorption or transmittance, to the laser at a particular wavelength.

For example, in some embodiments where a laser at 355-nm wavelength provide by a laser source is used, a laser absorption of the second adhesive layer 1500 including at least one of the above-mentioned material may be 0 to about 20%, and a laser absorption of the first adhesive layer 314 including at least one of the above-mentioned material may be about 80% to about 100%. In another words, the laser at 355-nm wavelength may basically pass through the second adhesive layer 1500, and be absorbed by the first adhesive layer 314.

The present disclosure discloses various embodiments to provide a device of mass transferring chips with a first substrate and a second substrate transferring the chips. A patterned recess formed on the first substrate or the second substrate can increase a flatness of the first substrate or the second substrate and facilitate an escape of gas produced between the first substrate and the second substrate, thereby increasing a transfer rate of the chips.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A device of mass transferring chips, comprising:
   a first substrate, comprising:
      a first surface, comprising a chip-connecting area configured to connect a chip;
      a second surface opposite to the first surface; and
      a patterned recess, disposed on the second surface of the first substrate, the pattern recess comprising a patterned through hole connecting the first surface and the second surface of the first substrate, wherein a projection of at least a portion of the patterned recess on the first surface is spaced apart from the chip-connecting area; and
   a second substrate, comprising a third surface, wherein the third surface comprises a chip-receiving area configured to attach the chip from the first substrate.

2. The device of mass transferring chips of claim 1, wherein a position of the patterned through hole on the first surface is spaced apart from the chip-connecting area.

3. The device of mass transferring chips of claim 1, wherein the second substrate comprises:
   a first adhesive layer, wherein the third surface is located on the first adhesive layer;
   a fourth surface opposite to the third surface; and
   a second adhesive layer, wherein the fourth surface is located on the second adhesive layer.

4. The device of mass transferring chips of claim 3, further comprising a laser source configured to provide a laser, wherein a first absorption of the laser by the first adhesive layer is different from a second absorption of the laser by the second adhesive layer.

5. The device of mass transferring chips of claim 4, wherein the laser is absorbed by the first adhesive layer and passes through the second adhesive layer.

6. The device of mass transferring chips of claim 4, wherein a wavelength of the laser is about 355 nanometers.

7. The device of mass transferring chips of claim 3, wherein a thickness of the second adhesive layer is greater than a thickness of the first adhesive layer by about 20% to about 50% of the thickness of the first adhesive layer.

* * * * *